United States Patent
Kim et al.

(10) Patent No.: US 7,411,241 B2
(45) Date of Patent: Aug. 12, 2008

(54) VERTICAL TYPE NANOTUBE SEMICONDUCTOR DEVICE

(75) Inventors: Ki-Nam Kim, Seoul (KR); Yun-Gi Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 175 days.

(21) Appl. No.: 11/325,964

(22) Filed: Jan. 5, 2006

(65) Prior Publication Data
US 2006/0244361 A1    Nov. 2, 2006

(30) Foreign Application Priority Data
Mar. 28, 2005   (KR) .................. 10-2005-0025368

(51) Int. Cl.
*H01L 27/108*   (2006.01)
(52) U.S. Cl. ............... 257/306; 257/401; 257/E27.086; 257/E29.13; 977/938
(58) Field of Classification Search .......... 257/E29.096, 257/296, 306, 309, 401, E27.086, E29.13; 977/938
See application file for complete search history.

(56) References Cited

U.S. PATENT DOCUMENTS

| | | | |
|---|---|---|---|
| 6,599,808 B2 * | 7/2003 | Kim et al. | 438/400 |
| 6,617,639 B1 * | 9/2003 | Wang et al. | 257/324 |
| 6,798,000 B2 * | 9/2004 | Luyken et al. | 257/213 |
| 7,253,431 B2 * | 8/2007 | Afzali-Ardakani et al. | 257/20 |
| 7,262,991 B2 | 8/2007 | Zhang et al. | |

FOREIGN PATENT DOCUMENTS

| | | |
|---|---|---|
| JP | 2004-146520 | 5/2004 |
| KR | 1020000050788 A | 8/2000 |
| KR | 1020020001259 A | 1/2002 |

* cited by examiner

*Primary Examiner*—Minh-Loan T Tran
(74) *Attorney, Agent, or Firm*—Myers Bigel Sibley & Sajovec

(57) ABSTRACT

A vertical type nanotube semiconductor device including a nanotube bit line, disposed on a substrate and in parallel with the substrate and composed of a nanotube with a conductive property, and a nanotube pole connected to the bit line vertically to the substrate and provides a channel through which carriers migrate. By manufacturing the semiconductor device using the bit line composed of the nanotube, cutoff of an electrical connection of the bit line is prevented and an integration density of the semiconductor device can be improved.

18 Claims, 8 Drawing Sheets

VERTICAL TYPE NANOTUBE SEMICONDUCTOR DEVICE

REFERENCE TO PRIORITY APPLICATION

This application claims the benefit of Korean Patent Application No. 10-2005-0025368, filed Mar. 28, 2005, the disclosure of which is hereby incorporated herein by reference.

FIELD OF THE INVENTION

The present invention relates to integrated circuit devices and, more particularly, to integrated circuit devices having nanotube conductive layers therein.

BACKGROUND OF THE INVENTION

Nanotubes with conductive properties are cylindrical members with highly microscopic diameters of several to several tens of nanometers and significantly large aspect ratios of about 10~1,000. Carriers are migrated by ballistic transport within a nanotube having a generally uniform resistance along its length. Particularly, a carbon nanotube has carrier mobility of about 70 times or more than that of silicon at a room temperature.

Because of excellent electrical characteristics, nanotubes can be applied to semiconductor devices, flat panel displays, batteries, various sensors, etc. Particularly, in a conventional nanotube semiconductor device, the nanotube is used as a channel through which carriers are migrated or is used as a lower electrode of a capacitor.

A bit line applied to a conventional nanotube semiconductor device can be fabricated to have a diameter of about several to several hundreds of nanometers. However, if the bit line of several to several hundreds of nanometers is fabricated in a typical manner that simply decreases a width of a conductive material, then grain boundary defects within the bit line may cut off electrical connection.

SUMMARY OF THE INVENTION

Embodiments of the invention include integrated circuit devices having nanotube elements therein. In some of these embodiments, a device is provided with a substrate and an electrically conductive nanotube bit line on the substrate. This nanotube bit line is electrically coupled to a field effect transistor. In particular, a field effect transistor is provided, which has a first current carrying terminal (e.g., drain terminal) electrically connected to the nanotube bit line. The field effect transistor may include a nanotube channel region and a gate electrode surrounding the nanotube channel region. According to aspects of these embodiments, the nanotube bit line includes at least one material selected from a group consisting of C, ZnO, CdO, $In_2O_3$, MgO, $Al_2O_3$, AlN, InN, GaN, Si, AlP, InP, GaP, InAs, GaAs, AlAs, InSb, GaSb, ZnSe, ZnS, CdS, CdSe and BiSb. This nanotube bit line may be doped with a dopant selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb and H. In some cases, the device may be a dynamic random access memory (DRAM) cell that includes a capacitor having a nanotube electrode electrically connected to a second current carrying terminal (e.g., source terminal) of the field effect transistor. The capacitor may also include a capacitor having a dielectric layer covering the nanotube electrode. Barrier layers may also be provided to improve adhesion and electrical connections within the memory cell. In particular, a first electrically conductive barrier layer may be provided that extends between the electrically conductive nanotube bit line and the nanotube channel region. A second electrically conductive barrier layer may also be provided that extends between the nanotube electrode and the second current carrying terminal of the field effect transistor. These electrically conductive barrier layers may be formed of a material selected from a group consisting of Ni, Co, Fe, alumina and carbon-based conductive materials.

According to another embodiment of the invention, a vertical nanotube semiconductor device is provided. A bit line is disposed on the substrate in parallel with the substrate. This bit line is formed as a nanotube with a conductive property. Also, a nanotube pole, which is connected to the bit line in a vertical direction to the substrate, provides a channel through which carriers migrate. Also, a gate insulating layer encircling the nanotube pole to a uniform thickness is included. A gate electrode encircles the gate insulating layer to control formation of the channel and carrier migration.

The bit line may be formed of a material selected from a group consisting of C, ZnO, CdO, $In_2O_3$, MgO, $Al_2O_3$, AlN, InN, GaN, Si, Alp, InP, GaP, InAs, GaAs, AlAs, InSb, GaSb, ZnSe, ZnS, CdS, CdSe, BiSb, and combinations of these materials. The bit line is doped with at least one material selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb, and H. Additionally, a diameter of the bit line may be in a range of 1~100 nm.

In addition, a first barrier layer for improving a bonding strength between the bit line and the nanotube pole may be included. The first barrier layer may be formed of at least one material selected from a group consisting of Ni, Co, Fe, alumina, and a carbon-based conductive material.

The nanotube pole is formed of a material selected from a group consisting of C, ZnO, CdO, $In_2O_3$, MgO, $Al_2O_3$, AlN, InN, GaN, Si, AlP, InP, GaP, InAs, GaAs, AlAs, InSb, GaSb, ZnSe, ZnS, CdS, CdSe, BiSb, and combinations of these materials. The nanotube pole may be doped with at least one material selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb, and H. A height of the nanotube pole may be the same as a length of the channel.

The gate electrode is one of a single layer formed of a material selected from the group consisting of amorphous polysilicon, doped polysilicon, poly-SiGe, and a conductive metal containing one or more metal layers. Moreover, the gate electrode may be formed as a plurality of gate electrodes spaced apart from one another by a predetermined interval.

Additional embodiments of the invention include methods of manufacturing a vertical type nanotube semiconductor device. A bit line is formed on the substrate in parallel with the substrate. The bit line may be a nanotube with a conductive property. A nanotube pole that is connected to the bit line in a vertical direction to the substrate is formed to provide a channel through which carriers migrate. After forming a gate insulating layer encircling the nanotube pole to a uniform thickness, a gate electrode is formed that encircles the gate insulating layer controls the formation of the channel.

At this time, the bit line may be formed using a method such as plasma CVD, thermal CVD, low pressure CVD, and MOCVD.

The first barrier layer may be formed to improve the bonding strength between the bit line and the nanotube pole. After forming a second insulating layer covering the substrate on which the bit line is formed, a hole for the barrier layer is formed within the second insulating layer to expose the bit line. A first barrier material layer is deposited to fill the hole for the barrier layer. Also, the first barrier layer is formed by removing the first barrier material layer so as to expose and planarize an upper surface of the second insulating layer.

The forming of the nanotube pole includes forming a third insulating layer that covers the substrate on which the bit line is formed, and forming a nanotube hole within the third insulating layer to expose the bit line. Then, a nanotube material layer is formed to fill the second contact hole, and the nanotube pole is formed by removing the nanotube material layer to expose and planarize an upper surface of the third insulating layer.

The formation of the nanotube pole may include forming a third insulating layer on the second insulating layer on which the first barrier layer is formed, and forming a nanotube hole within the third insulating layer to expose the first barrier layer. After forming a nanotube material layer to fill the nanotube hole, the nanotube pole is formed by removing the nanotube material layer to expose and planarize an upper surface of the third insulating layer.

The step of forming the gate insulating layer may include removing the third insulating layer on which the nanotube pole is formed, and forming a gate insulating material layer encircling the nanotube pole by blanket deposition. After forming a first mask layer on the nanotube pole and the gate insulating material layer, the gate insulating layer is formed by removing the gate insulating material layer using the first mask layer as an etch mask.

In some embodiments of the invention, the gate electrode may have a plurality of gate electrodes spaced apart from one another by a predetermined interval. The forming of the plurality of gate electrodes includes forming the nanotube pole on the second insulating layer covering the substrate where the bit line is formed, and forming the first gate electrode on a lower portion of the nanotube pole. After forming a sixth insulating layer to expose an upper surface of the nanotube while covering the first gate electrode, the second gate electrode is formed on an exposed portion of the nanotube pole.

According to further aspects of the embodiments, a capacitor lower electrode may be formed, which is composed of a nanotube. This electrode is formed to be vertically and serially connected to the nanotube pole. The forming of a lower electrode may include forming a fourth insulating layer on the substrate on which the nanotube pole, the gate insulating layer and the gate electrode have been formed. Then, a lower electrode is formed to the other end of the nanotube pole.

A second barrier layer may be formed for improving a bonding strength between the nanotube pole and the nanotube lower electrode. The formation of the second barrier layer includes forming a fourth insulating layer on the substrate where the nanotube bar, the gate insulating layer and the gate electrode are formed. After forming a nanotube pole recessed with respect to the gate insulating layer that removes an upper portion of the nanotube pole, a second barrier material layer is formed on the fourth insulating layer to a predetermined thickness while covering an upper surface of the recessed nanotube pole. Then, the second barrier layer is formed by patterning the second barrier material layer to firmly contact the lower electrode that is formed on the nanotube pole. In this case, the lower electrode may be formed by growing the lower electrode composed of the nanotube on the second barrier layer.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
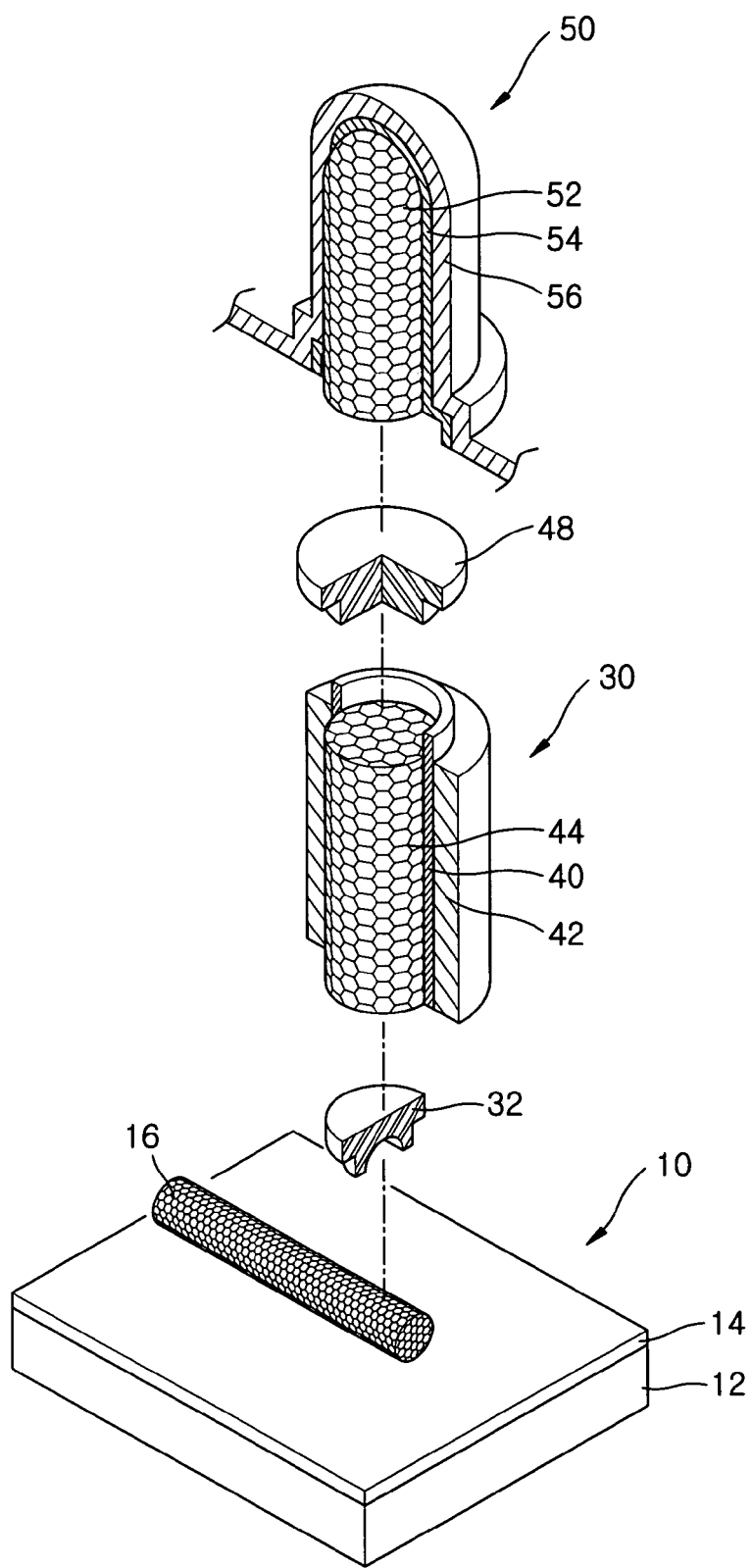
FIG. 1 is an exploded perspective view of a vertical type nanotube semiconductor device according to a first embodiment of the present invention.
Figure 2:
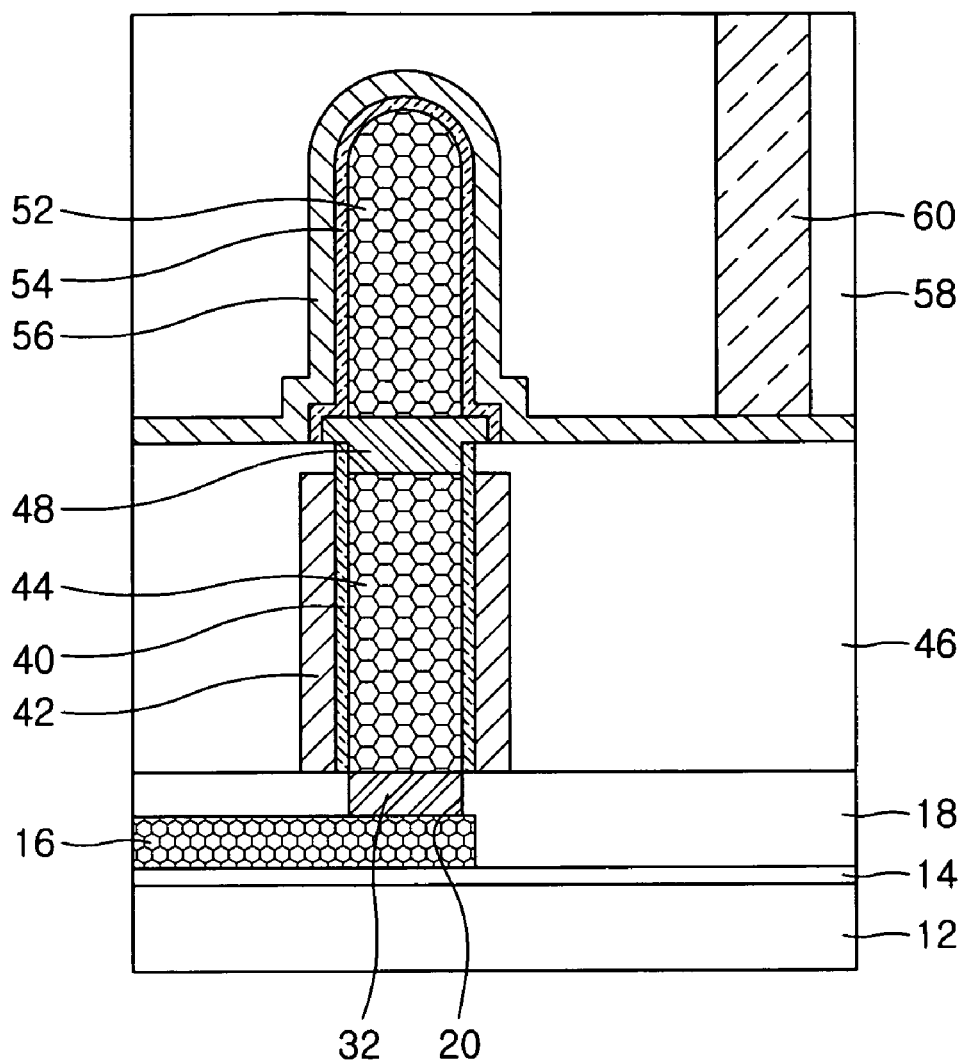
FIG. 2 is a cross-sectional view of the vertical type nanotube semiconductor device of FIG. 1.

A nanotube semiconductor device according to the present invention has a vertical type structure. That is, a bit line formed on a substrate and an active region formed with a channel are arranged in the vertical direction with respect to the substrate. FIG. 1 is a perspective view of respective parts of a vertical type nanotube semiconductor device according to a first embodiment of the present invention. FIG. 2 is a cross-sectional view showing major portions of FIG. 1. Referring to FIGS. 1 and 2, the vertical type nanotube semiconductor device includes a bit line part 10, a transistor part 30 and a capacitor part 50. The bit line part 10 includes a bit line 16 consisting of a nanotube with a conductive property disposed on a substrate 12 in parallel with the substrate 12. A first insulating layer 14 for electrical insulation may be disposed between the substrate 12 and the bit line 16. One end of the bit line 16 is connected to a recessed nanotube pole 44 extending vertically to the substrate 12. The nanotube pole 44 provides a channel through which carriers can migrate. Preferably, the height of the nanotube pole 44 is similar to a length of the channel. A first barrier layer 32 may be interposed between the bit line 16 and the nanotube pole 44 to enhance a bonding strength therebetween. A gate insulating layer 40 encircles the nanotube pole 44 to a uniform thickness. A gate electrode 42 encircles the gate insulating layer 40 and controls formation of the channel. A capacitor lower electrode 52 is vertically connected to the other end of the nanotube pole 44 to be in line with the nanotube pole 44. At this time, a second barrier layer 48 for improving a bonding strength may be formed between the recessed nanotube pole 44 and the capacitor lower electrode 52.

A dielectric film 54 is composed of a material with a high dielectric constant (e.g., ONO or $Ta_2O_5$). The dielectric film 54 covers the lower electrode 52 and the exposed surface of the second barrier layer 48. An upper electrode 56 is formed by depositing a conductive material, such as a polycrystalline silicon doped with impurities, on the entire surface of the dielectric film 54. An upper electrode contact 60 formed within a fifth insulating layer 58 is also provided. The upper electrode contact 60 is electrically connected to the upper electrode 56.

Figure 3:
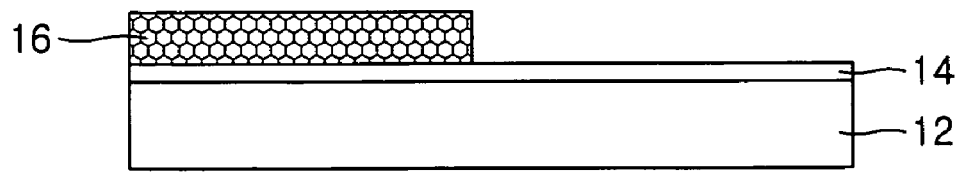
FIGS. 3 through 10 are cross-sectional views illustrating a method of manufacturing a vertical type nanotube semiconductor device according to the first embodiment of the present invention.

FIGS. 3 through 10 are cross-sectional views illustrating a method of manufacturing the vertical type nanotube semiconductor device according to the first embodiment. Referring to FIG. 3, the first insulating layer 14 for electrical insulation of the substrate 12 from the bit line 16 is formed on the substrate 12. The first insulating layer 14 may be a silicon oxide layer formed through thermal oxidation. The substrate 12 may be at least one layer selected from a silicon layer, a GaAs layer, a $SiO_2$ layer and an alumina layer. Other substrates may also be used. A conductive line (not shown) or a conductive region (not shown) may be separately formed within the substrate 12.

The bit line 16 may be formed using any one method selected from plasma CVD, thermal CVD, low pressure CVD, and MOCVD. When using CVD, a catalyst layer (not shown) may be formed in advance to induce a growth of the nanotube on the substrate 12 or the first insulating layer 14, thereby making a density of the nanotube across the substrate 12 or the first insulating layer 14 uniform. Here, the catalyst layer denotes either a catalyst that becomes a base of the growth of the nanotube or an optional material containing the catalyst. On the other hand, the nanotube may be fabricated without forming the catalyst layer, when using MOCVD.

The bit line 16, which is shown as a nanotube, may be formed of a material selected from a group consisting of C, ZnO, CdO, $In_2O_3$, MgO, $Al_2O_3$, AlN, InN, GaN, Si, AlP, InP, GaP, InAs, GaAs, AlAs, InSb, GaSb, ZnSe, ZnS, CdS, CdSe, BiSb, and an alloy of two or more of these materials. The bit line 16 may be doped with at least one material selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb and H. At this time, the bit line 16 may have a diameter of 1~100 nm.

Figure 4:
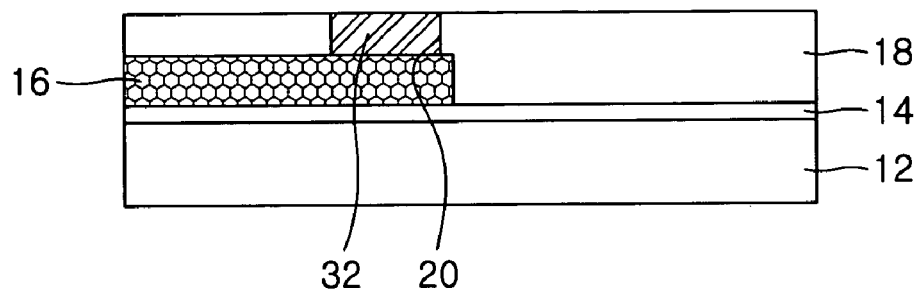
Figure 6:
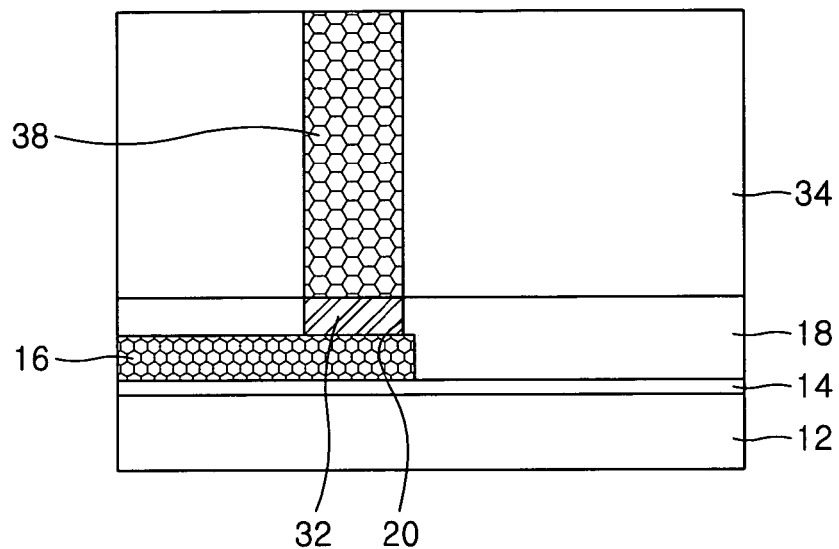

Referring to FIG. 4, a first barrier layer 32 for improving bonding strength is formed between the bit line 16 and the nanotube pole 38 (see FIG. 6). At this time, the first barrier layer 32 may act as the catalyst layer as described in FIG. 3. The first barrier layer 32 may be composed of at least one material selected from a group consisting of Ni, Co, Fe, alumina, and a carbon-based conductive material.

In order to form the first barrier layer 32, a second insulating layer 18 (e.g., a silicon oxide layer), is formed to cover the substrate 12 having the bit line 16 formed thereon. Then, a hole 20 for a barrier layer is formed in the second insulating layer 18 to partially expose the bit line 16. The hole 20 for the barrier layer has an upper portion large enough to accept the nanotube pole 38 and a lower portion large enough to firmly contact the bit line 16. Then, a first barrier material is deposited so as to fill the hole 20. The first barrier material is removed to expose and planarize the upper surface of the second insulating layer 18, thereby forming the first barrier layer 32.

The first barrier layer 32 may be used as a drain of the semiconductor device according to the first embodiment. If the first barrier layer 32 acts as the drain of the semiconductor device, a thickness of the first barrier layer 32 may depend upon electrical characteristics of the drain. In particular, the first barrier layer 32 may need to be thick to reduce drain resistance. If necessary, the nanotube pole 38 is directly connected to the bit line 16 without forming the first barrier layer 32. This is because an extra source/drain structure may not be required due to the formation of the channel by the gate electrode 42.

Figure 5:
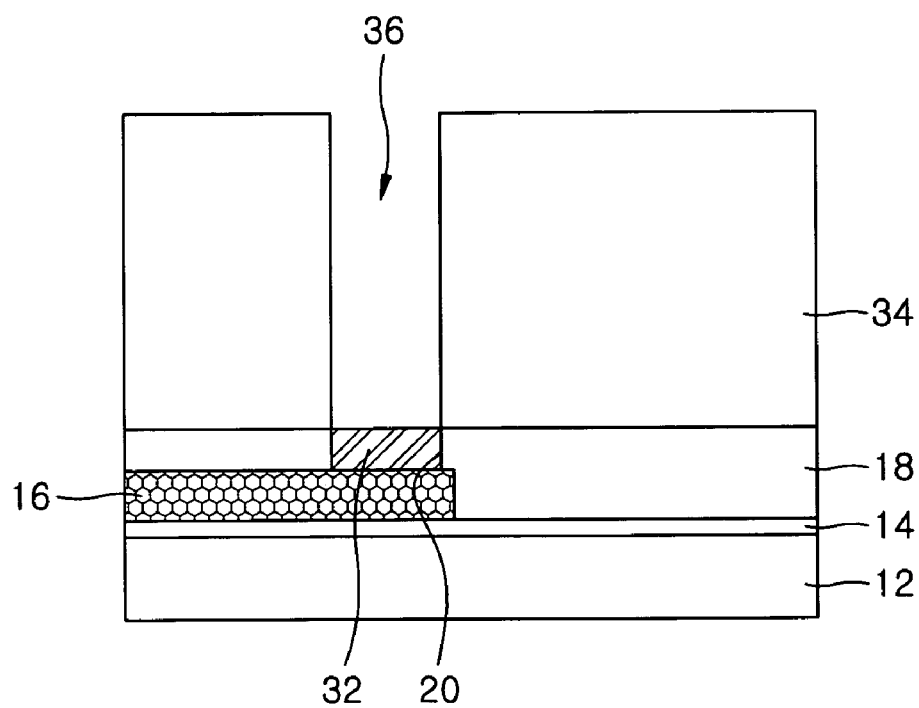

Referring to FIG. 5, a third insulating layer 34 is formed on the second insulating layer 18 having the first barrier layer 32 already formed thereon. Subsequently, a nanotube hole 36 that exposes an upper surface of the first barrier layer 32 is formed within the third insulating layer 34. The nanotube hole 36 is a space where the nanotube pole 38 is to be formed. The reason why the nanotube pole 38 is grown within the nanotube hole 36 instead of being grown on the first barrier layer 32 without being restricted by the nanotube hole 36 is that the dimension of the nanotube pole 38 can be precisely controlled.

If the nanotube pole 38 is formed without forming the first barrier layer 32, the third insulating layer 34, (e.g., a silicon oxide layer or a block copolymer), is formed to cover the substrate 12 or the first insulating layer 14 having the bit line 16 formed thereon. Thereafter, the nanotube hole 36, which partially exposes the bit line 16, is formed in the third insulating layer 34. The nanotube hole 36 may be formed in various ways. For example, the block copolymer is partially removed, or the silicon oxide layer is patterned, to form the nanotube hole 36.

Referring to FIG. 6, a nanotube material layer is formed so as to fill the nanotube hole 36. Then, the nanotube material layer is removed to expose and planarize the upper surface of the third insulating layer 34, thereby forming the nanotube pole 38. Similar to the bit line 16, the nanotube material layer may be formed using any one method selected from plasma CVD, thermal CVD, low pressure CVD, and MOCVD.

The nanotube pole 38 may be formed of a material selected from a group consisting of C, ZnO, CdO, $In_2O_3$, MgO, $Al_2O_3$, AlN, InN, GaN, Si, AlP, InP, GaP, InAs, GaAs, AlAs, InSb, GaSb, ZnSe, ZnS, CdS, CdSe, BiSb, and an alloy of two or more of these materials. The nanotube pole 38 may be doped with at least one material selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb, and H.

Figure 7:
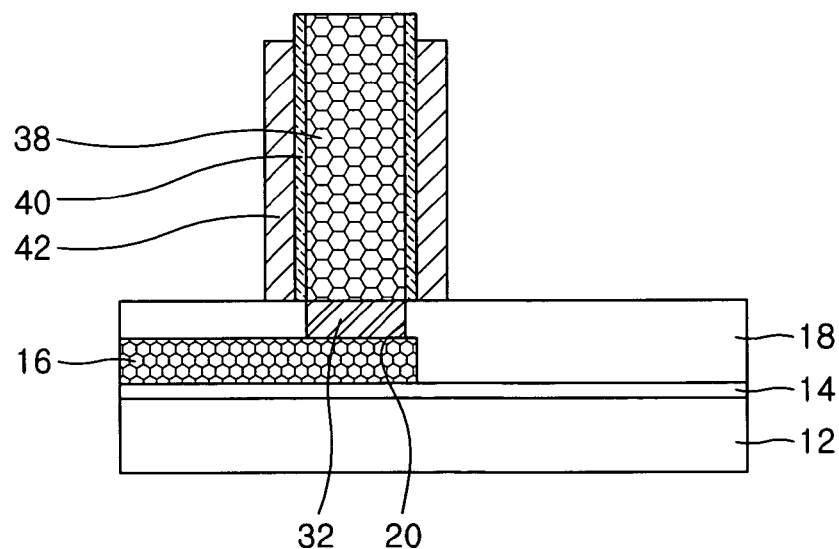

Referring to FIG. 7, to form the gate insulating layer 40, the third insulating layer 34 is removed. Then, a gate insulating material layer that encircles the nanotube pole 38 is formed by blanket deposition. A first mask layer (not shown) for forming the gate insulating layer 40 to a uniform thickness is formed on the nanotube pole 38 and the gate insulating material layer. After this, the gate insulating material layer is removed using the first mask layer as an etch mask to form the gate insulating layer 40. The gate insulating layer 40 may be either a silicon oxide layer or a stacked layer of silicon oxide/silicon nitride/silicon oxide (i.e., ONO layer).

Thereafter, the gate electrode 42 encircling the gate insulating layer 40 and controlling the channel formation is formed using a typical depositing method. Preferably, the gate electrode 42 is lower than the gate insulating layer 40. The gate electrode 42 may be formed of either a single layer selected from a group consisting of amorphous polysilicon, doped polysilicon, poly-SiGe, and a conductive metal or a composite layer of these materials. The conductive metal may be a material selected from a group consisting of a metal such as W and Mo, and a conductive metal nitride such as TiN, TaN or WN.

Figure 8:
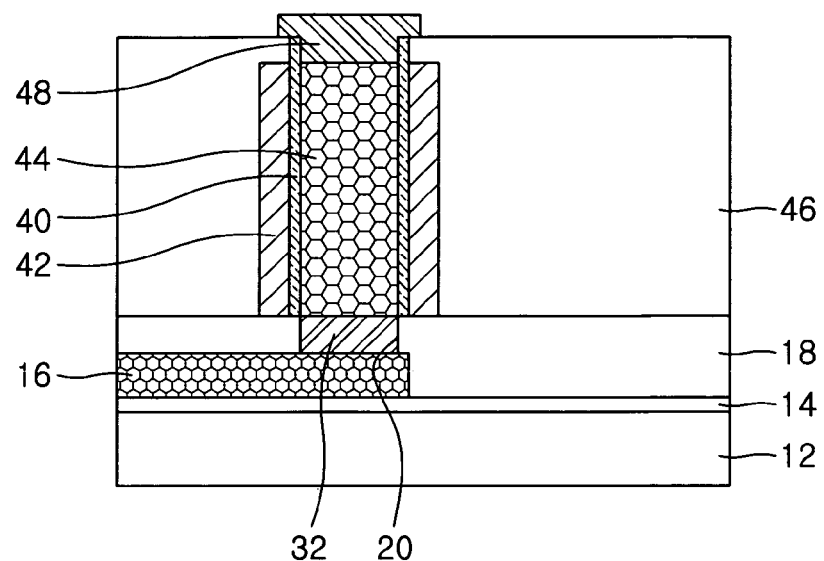

Referring to FIG. 8, the second barrier layer 48 is formed to improve the bonding strength between the nanotube pole 38 and the nanotube lower electrode 52. The second barrier layer 48 may act as the catalyst layer as described above with reference to FIG. 3. The second barrier layer 48 may be formed of at least one material selected from a group consisting of Ni, Co, Fe, alumina, and a carbon-based conductive material. In order to form the second barrier layer 48, the fourth insulating layer 46 is formed on the second insulating layer 18 on which the nanotube pole 38, the gate insulating layer 40 and the gate electrode 42 have been formed. Then, the fourth insulating layer 46 is planarized to expose the nanotube pole 38. An upper portion of the nanotube pole 38 is removed to form the nanotube pole 44 recessed with respect to the gate insulating layer 40. The height of the recessed nanotube pole 44 may be the same as the channel length. A second barrier material layer is formed on the fourth insulating layer 46 to a predetermined thickness while covering the recessed nanotube pole 44. Thereafter, the second barrier material layer is patterned to firmly contact the lower electrode 52 to be formed on the recessed nanotube pole 44, thereby forming the second barrier layer 48.

Figure 9:
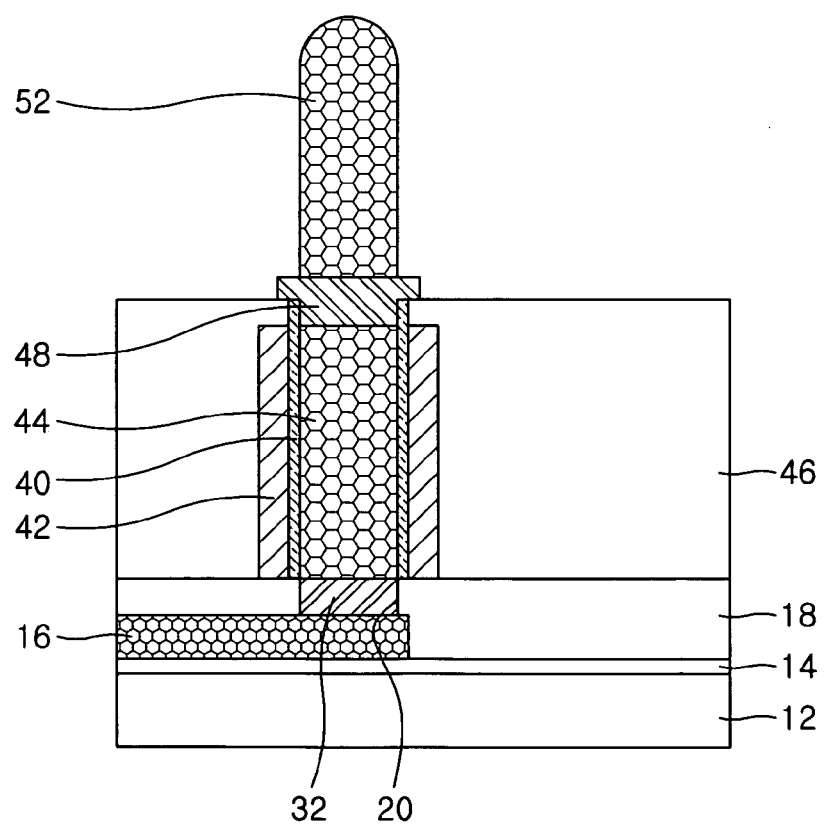

Referring to FIG. 9, the lower electrode 52 composed of a nanotube is grown on the second barrier layer 48. Similar to the formation of the bit line 16, the lower electrode 52 may be formed using any one method selected from plasma CVD, thermal CVD, low pressure CVD, and MOCVD. The lower electrode 52 may be formed of a material selected from a group consisting of C, ZnO, CdO, $In_2O_3$, MgO, $Al_2O_3$, AlN, InN, GaN, Si, AlP, InP, GaP, InAs, GaAs, AlAs, InSb, GaSb, ZnSe, ZnS, CdS, CdSe, BiSb, and an alloy of these. The lower electrode 52 may be doped with at least one material selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb, and H.

Figure 10:
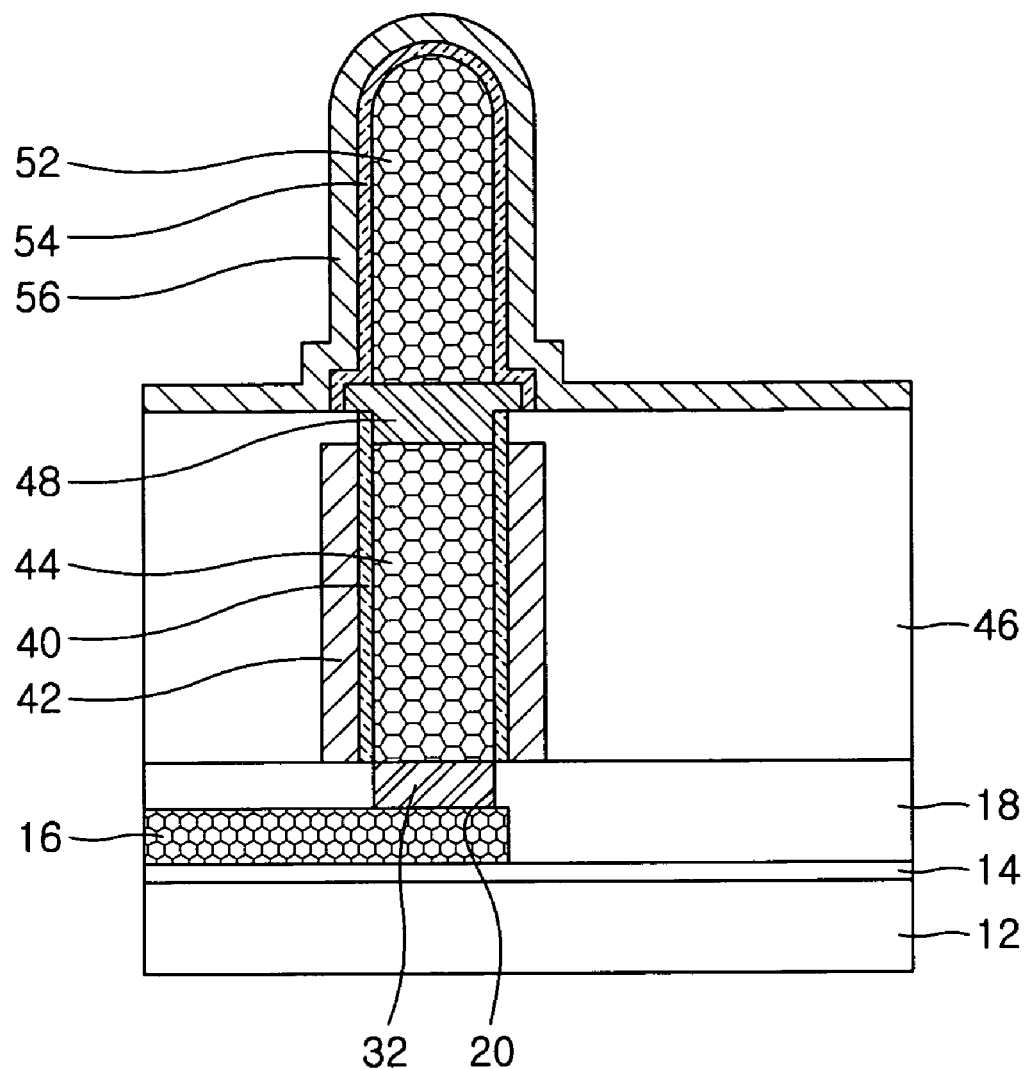

Referring to FIG. 10, the dielectric film 54, which is formed of a material with a high dielectric constant, (e.g., ONO or $Ta_2O_5$), that covers the lower electrode 52 and the exposed surface of the second barrier layer 48, is formed to a uniform thickness. Thereafter, a conductive material such as polycrystalline silicon doped with impurities is deposited on the entire surface of the dielectric film 54 to a uniform thickness, thereby forming the upper electrode 56. Subsequently, as illustrated by FIG. 2, the upper electrode contact 60 disposed within the fifth insulating layer 58 that covers the upper electrode 56 is formed to provide an electrode terminal that may be connected to another device (not shown).

In the nanotube semiconductor device according to the first embodiment, the nanotube pole or the nanotube pole/nanotube lower electrode is vertically and serially arranged on the bit line, so that an area of the semiconductor device is minimized. Therefore, an integration density of the semiconductor device can be improved.

Figure 11:
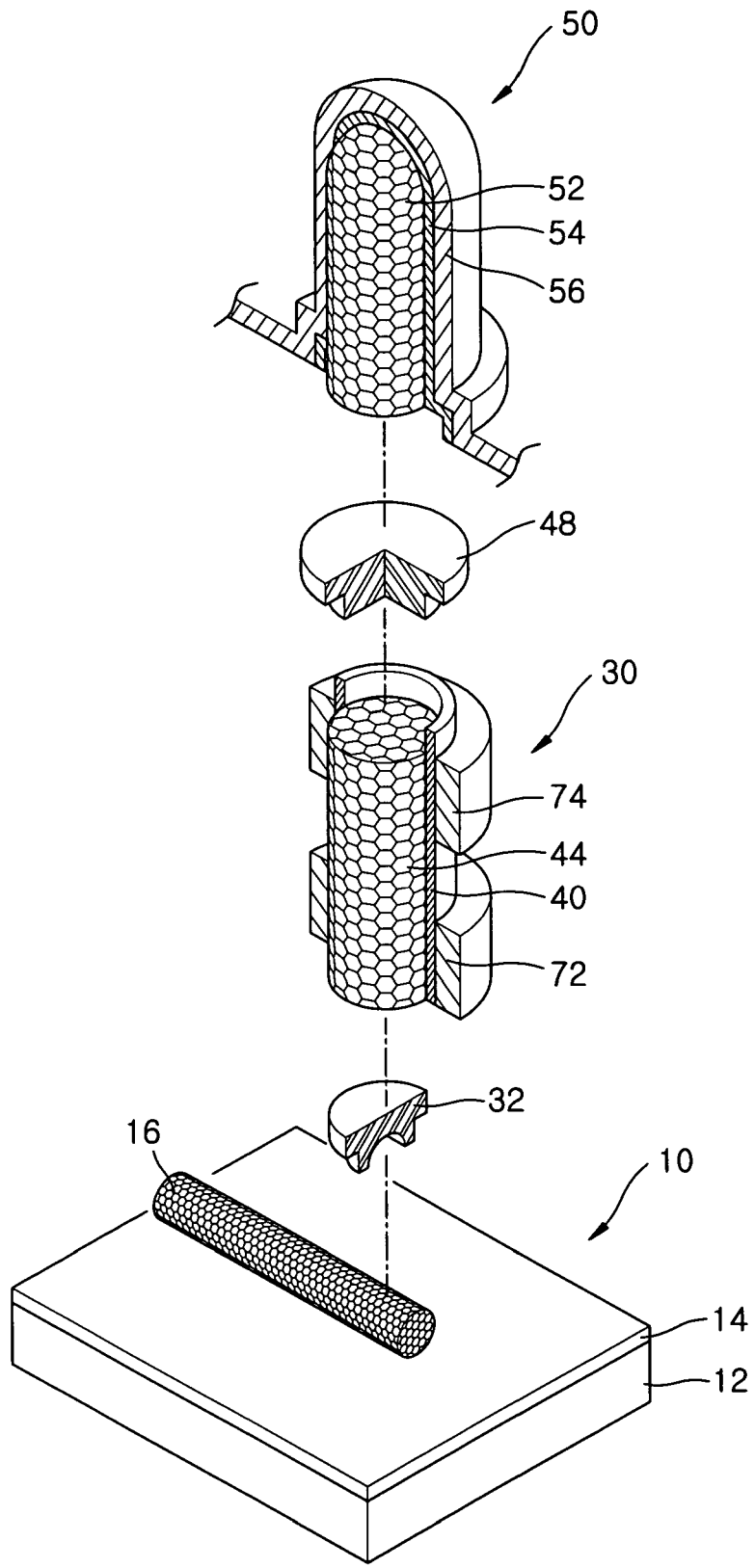
FIG. 11 is an exploded perspective view of a vertical type nanotube semiconductor device according to a second embodiment of the present invention.
Figure 12:
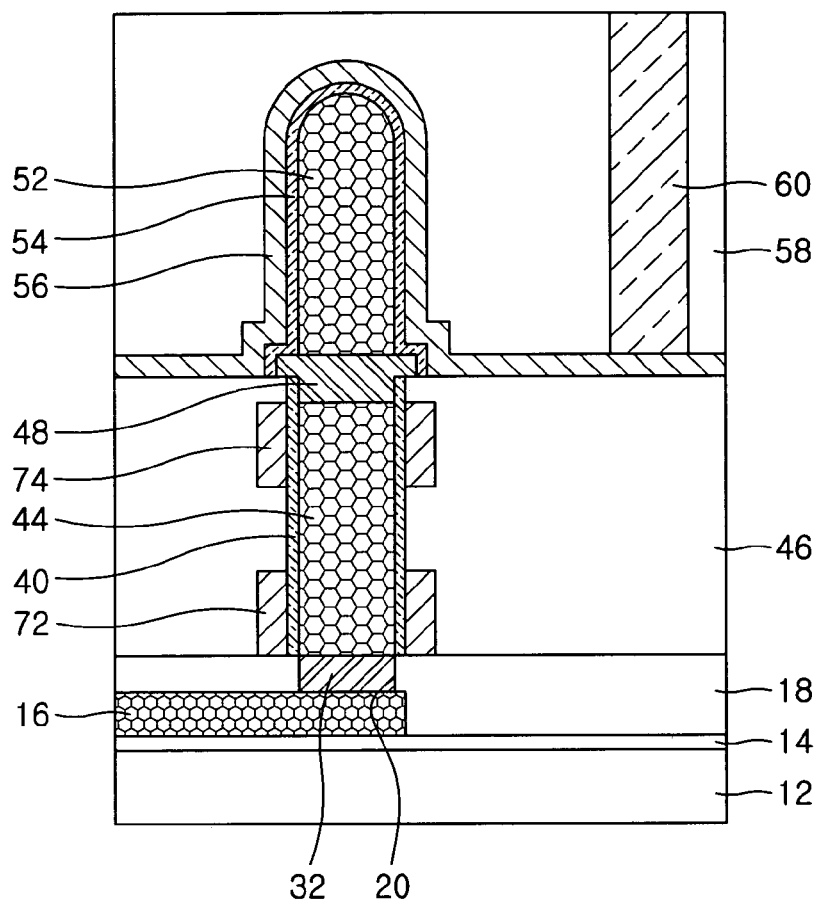
FIG. 12 is a cross-sectional view of the vertical type nanotube semiconductor device of FIG. 11.

FIG. 11 is an exploded perspective view of a vertical type nanotube semiconductor device according to a second embodiment of the present invention. FIG. 12 is a cross-sectional view showing major portions of the device of FIG. 11. Referring to FIGS. 11 and 12, the vertical type nanotube semiconductor device is largely comprised of the bit line part 10, the transistor part 30, and the capacitor part 50. The bit line part 10 includes the bit line 16 consisting of the nanotube with the conductive property, and is disposed on the substrate 12 in parallel with the substrate 12. A first insulating layer 14 may be formed for electrical insulation between the substrate 12 and the bit line 16. The nanotube bit line 16 can be formed to have a nanometer dimension, and hardly has a grain boundary in the nanometer dimension, so that an electrical cutoff does not occur.

One end of the bit line 16 is connected to the recessed nanotube pole 44 extending in the vertical direction to the substrate 12. The recessed nanotube pole 44 provides the channel through which carriers are migrated. Preferably, the height of the nanotube pole 44 is the same as the channel length. The first barrier layer 32 may be interposed between the bit line 16 and the nanotube pole 44 to improve the bonding strength.

The gate insulating layer 40 encircles the nanotube pole 44 to a uniform thickness. The gate electrode 42 surrounds the gate insulating layer 40, and controls the channel formation. A gate electrode according to the second embodiment may be formed of a plurality of gate electrodes 72 and 74 spaced apart from each other by a predetermined interval.

The capacitor lower electrode 52 is vertically and serially connected to the other end of the nanotube pole 44. At this time, the second barrier layer 48 may be formed to improve the bonding strength between the recessed nanotube pole 44 and the nanotube lower electrode 52.

The dielectric film 54 is composed of a material with a high dielectric constant (e.g., ONO or $Ta_2O_5$) that covers the lower electrode 52 and the exposed surface of the second barrier layer 48. The upper electrode 56 is disposed on the entire surface of the dielectric film 54 by depositing a conductive material such as polycrystalline silicon doped with impurities. The upper electrode contact 60 is formed within the fifth insulating layer 58 covering the upper electrode 56 electrically connects to the outside (see, e.g., FIG. 2).

Figure 13:
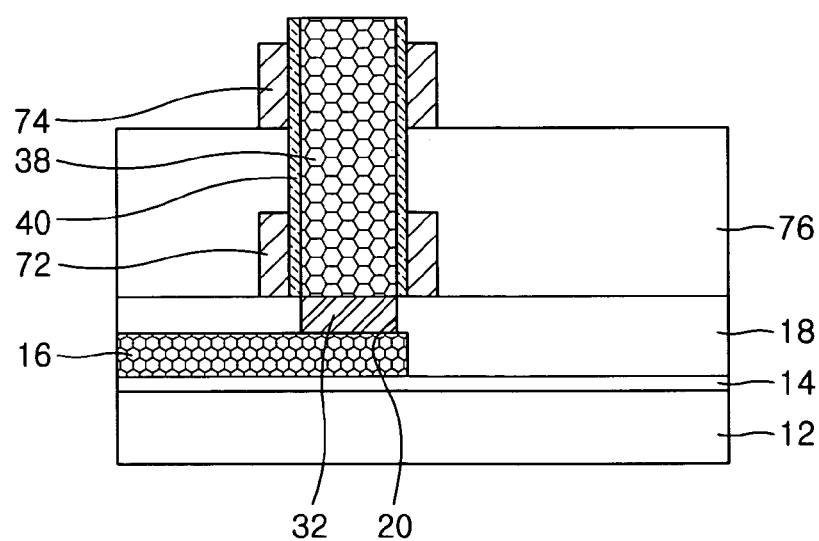
FIG. 13 is a cross-sectional view illustrating a method of fabricating a plurality of gate electrodes in the vertical type nanotube semiconductor device according to the second embodiment of the present invention.

A method of manufacturing the vertical type nanotube semiconductor device according to the second embodiment is similar to that for the first embodiment described with reference to FIGS. 3 through 9 except for the formation of the gate electrodes, so a description of duplicate parts will be omitted. FIG. 13 is a cross-sectional view illustrating a method of fabricating the plurality of gate electrodes 72 and 74 in the vertical type nanotube semiconductor device according to the second embodiment. Referring to FIG. 13, to form the plurality of gate electrodes 72 and 74, first, the nanotube pole 38 is formed on the second insulating layer 18 covering the substrate 12 on which the bit line 16 is formed. Then, the first gate electrode 72 encircles a lower side surface of the nanotube pole 38 as in the first embodiment. A sixth insulating layer 76 that exposes an upper portion of the nanotube pole 38 but covers the first gate electrode 72 is formed. The second gate electrode 74 is formed on an exposed side surface of the nanotube pole 38.

According to the nanotube semiconductor device of the second embodiment, the nanotube pole or nanotube pole/nanotube lower electrode is vertically and serially formed on the bit line. Thus, an area of the semiconductor device is minimized. Therefore, an integration density of the semiconductor device can be improved.

According to a vertical type nanotube semiconductor device according to the present invention and a method of manufacturing the same, a bit line composed of a nanotube is applied to the vertical type nanotube semiconductor device. Thus, the cut-off of the electrical connection of the bit line in the semiconductor device of nanometer level can be prevented. Furthermore, the bit line is formed on the substrate to embody a semiconductor device with a vertical type transistor, thereby improving the integration density of the semiconductor device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit device, comprising:
   a substrate;
   an electrically conductive bit line on said substrate; and
   a field effect transistor having a first current carrying terminal electrically connected to said bit line, said field effect transistor comprising a nanotube channel region and a gate electrode surrounding the nanotube channel region.

2. The device of claim 1, wherein said bit line is a nanotube bit line comprising a material selected from a group consisting of C, ZnO, OdO, In203, MgO, Al203, AlN, InN, GaN, Si, AlP, lnP, GaP, InAs, GaAs, AlAs, lnSb, GaSb, ZnSe, ZnS, CdS, CdSe and BiSb.

3. The device of claim 2, wherein said nanotube bit line is doped with a dopant selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb and H.

4. The device of claim 2, wherein a longitudinal axis of said nanotube bit line is orthogonal to a longitudinal axis of the nanotube channel region.

5. The device of claim 1, further comprising a first electrically conductive barrier layer extending between said bit line and the nanotube channel region.

6. The device of claim 5, wherein the first electrically conductive barrier layer comprises a material selected from a group consisting of Ni, Co, Fe, alumina and carbon-based conductive materials.

7. The device of claim 1, wherein the nanotube channel region comprises a material selected from a group consisting of C, ZnO, CdO, In203, MgO, Al203, AlN, InN, GaN, Si, AlP, lnP, GaP, InAs, GaAs, AlAs, lnSb, GaSb, ZnSe, ZnS, CdS, CdSe and BiSb.

8. The device of claim 7, wherein the nanotube channel region is doped with a dopant selected from a group consisting of Mg, Zn, Cd, Ti, Li, Cu, Al, Ni, Y, Ag, Mn, V, Fe, La, Ta, Nb, Ga, In, S, Se, P, As, Co, Cr, B, N, Sb and H.

9. The device of claim 1, wherein said field effect transistor further comprises a gate insulating layer extending between the gate electrode and the nanotube channel region.

10. The device of claim 9, wherein the gate insulating layer is an oxide/nitride/oxide (ONO) layer.

11. The device of claim 1, further comprising a capacitor having a nanotube electrode electrically connected to a second current carrying terminal of said field effect transistor.

12. The device of claim 11, wherein said capacitor comprises a capacitor dielectric layer covering the nanotube electrode.

13. The device of claim 11, further comprising a second electrically conductive barrier layer extending between the nanotube electrode and the second current carrying terminal of said field effect transistor.

14. The device of claim 11, wherein a longitudinal axis of said nanotube electrode is collinear with a longitudinal axis of the nanotube channel region.

15. A memory cell, comprising:
a substrate;
an electrically conductive bit line on said substrate;
an insulated-gate field effect transistor having a first source/drain region electrically connected to said bit line, said field effect transistor comprising a nanotube channel region and a gate electrode completely surrounding the nanotube channel region; and
a capacitor comprising:
a first nanotube electrode electrically connected to a second source/drain region of said insulated-gate field effect transistor;
a capacitor dielectric layer on the first nanotube electrode; and
a second electrode on the capacitor dielectric layer.

16. The memory cell of claim 15, wherein the first nanotube electrode is vertically aligned relative to the nanotube channel region so that a longitudinal axis of the first nanotube electrode is collinear with a longitudinal axis of the nanotube channel region.

17. The memory cell of claim 15, wherein said electrically conductive bit line is a nanotube bit line.

18. The memory cell of claim 17, wherein a longitudinal axis of the nanotube bit line is orthogonal to a longitudinal axis of the nanotube channel region.

* * * * *

UNITED STATES PATENT AND TRADEMARK OFFICE
CERTIFICATE OF CORRECTION

PATENT NO. : 7,411,241 B2
APPLICATION NO. : 11/325964
DATED : August 12, 2008
INVENTOR(S) : Kim et al.

It is certified that error appears in the above-identified patent and that said Letters Patent is hereby corrected as shown below:

Column 9, Claim 2, Line 1: Please correct "ZnO, OdO,"
 To read -- ZnO, CdO, --

Column 9, Claim 3, Line 8: Please correct "5, Se,"
 To read -- S, Se, --

Signed and Sealed this

Seventh Day of October, 2008

JON W. DUDAS
*Director of the United States Patent and Trademark Office*